United States Patent
Chiu et al.

(10) Patent No.: US 11,462,852 B2
(45) Date of Patent: Oct. 4, 2022

(54) BLIND MATE THERMAL COOLING SOLUTION FOR SMALL FORM FACTOR PLUGGABLE TRANSCEIVER

(71) Applicant: Google LLC, Mountain View, CA (US)

(72) Inventors: Jerry Chiu, Pacifica, CA (US);
Melanie Beauchemin, Mountain View, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 16/993,976

(22) Filed: Aug. 14, 2020

(65) Prior Publication Data
US 2022/0052474 A1  Feb. 17, 2022

(51) Int. Cl.
*H05K 7/20* (2006.01)
*H01R 13/502* (2006.01)
*G02B 6/42* (2006.01)
*H01R 43/26* (2006.01)

(52) U.S. Cl.
CPC .............. *H01R 13/502* (2013.01); *G02B 6/42* (2013.01); *G02B 6/4269* (2013.01); *H01R 43/26* (2013.01); *H05K 7/20* (2013.01)

(58) Field of Classification Search
None
See application file for complete search history.

(56) References Cited

U.S. PATENT DOCUMENTS

| | | | |
|---|---|---|---|
| 6,205,023 B1 | 3/2001 | Moribe et al. | |
| 6,496,369 B2 | 12/2002 | Nakamura | |
| 6,752,645 B2 * | 6/2004 | Nakamura | H01L 23/4093 257/E23.086 |
| 6,980,437 B2 | 12/2005 | Bright | |
| 7,036,574 B2 * | 5/2006 | Thompson | F28D 15/0233 165/185 |
| 7,048,452 B2 | 5/2006 | Malagrino, Jr. | |
| 7,101,093 B2 | 9/2006 | Hsiao et al. | |
| 7,355,857 B2 | 4/2008 | Pirillis et al. | |

(Continued)

FOREIGN PATENT DOCUMENTS

WO    1996028005 A1    9/1996

OTHER PUBLICATIONS

Extended European Search Report for European Patent Application No. 21172212.9 dated Nov. 15, 2021. 11 pages.

*Primary Examiner* — Courtney L Smith
(74) *Attorney, Agent, or Firm* — Lerner, David, Littenberg, Krumholz & Mentlik, LLP (57) ABSTRACT

The technology relates to a cage configured to removably receive a module. The cage may include a frame comprising a plurality of panels joined to one another, a lever pivotably coupled to the frame, and a heatsink pivotably coupled to the lever. The panels together may extend around a longitudinal recess configured to receive the module therein. The longitudinal recess may define a longitudinal axis thereof. A first one of the panels may have an aperture defined therein in communication with the longitudinal recess. A first end of the lever may extend into the longitudinal recess. The heatsink may be pivotably coupled to a second end of the lever opposite the first end. The heatsink may be movable in a translation direction transverse to the longitudinal axis. The heatsink may be translatable between a first position outside of the longitudinal recess and a second position partially inside the longitudinal recess.

20 Claims, 4 Drawing Sheets

(56) References Cited

U.S. PATENT DOCUMENTS

| | | |
|---|---|---|
| 7,371,965 B2 | 5/2008 | Ice |
| 7,539,018 B2 * | 5/2009 | Murr ................. H05K 7/20418 165/185 |
| 7,974,098 B2 * | 7/2011 | Oki ...................... G02B 6/4201 361/715 |
| 8,035,973 B2 | 10/2011 | McColloch |
| 8,081,470 B2 | 12/2011 | Oki et al. |
| 8,485,739 B2 | 7/2013 | Yi et al. |
| 8,670,236 B2 | 3/2014 | Szczesny et al. |
| 8,760,870 B2 * | 6/2014 | Yamamoto ........... G02B 6/4201 361/710 |
| 10,539,753 B1 * | 1/2020 | Leigh ...................... H01L 23/40 |
| 10,567,084 B2 | 2/2020 | Zhang et al. |
| 2003/0161108 A1 | 8/2003 | Bright et al. |
| 2007/0253168 A1 * | 11/2007 | Miller ................ H01R 13/7172 361/719 |
| 2010/0067196 A1 | 3/2010 | Costello et al. |
| 2012/0127665 A1 | 5/2012 | Prete et al. |
| 2013/0000865 A1 | 1/2013 | Shi |
| 2017/0269314 A1 | 9/2017 | Gaal |
| 2019/0011655 A1 * | 1/2019 | Hino .................... G02B 6/4261 |
| 2020/0260615 A1 | 8/2020 | Leigh et al. |

\* cited by examiner

BLIND MATE THERMAL COOLING SOLUTION FOR SMALL FORM FACTOR PLUGGABLE TRANSCEIVER

BACKGROUND

Optical module bandwidths have substantially increased due to machine learning demands, which has increased the importance of managing the thermal load of such modules. The next generation of some modules may require the power consumption to be almost doubled while maintaining the same standard exterior form factor. Current cooling solutions may not be able to permit a doubled power consumption while maintaining the same exterior form factor.

One conventional cooling solution provides a heatsink built onto the module using fins, but such fins may experience poor heat rejection within a standard module form factor. Another conventional cooling solution provides a heatsink built onto the cage into which the module is inserted, but such a solution may result in a poor thermal conduction path between the heatsink and the module due to minimal contact pressure between the heatsink and the module, caused by tolerances in the distance between the heatsink and the confronting surface of the module.

Therefore, conventional cooling solutions may not effectively manage the thermal load of the next generation of some modules while maintaining the same standard exterior form factor, which may result in damage to the module and/or the circuit board, or which may require an undesirable modification of the standard exterior form factor.

BRIEF SUMMARY

The present disclosure provides for a cage configured to removably receive a module, such as a small form factor high power pluggable transceiver, and a method for removably inserting such a module into a cage.

One aspect of the disclosure provides a cage configured to removably receive a module. The cage may include a frame comprising a plurality of panels joined to one another, a lever pivotably coupled to the frame, and a heatsink pivotably coupled to the lever. The panels together may extend around a longitudinal recess configured to receive the module therein. The longitudinal recess may define a longitudinal axis thereof. A first one of the panels may have an aperture defined therein in communication with the longitudinal recess. A first end of the lever may extend into the longitudinal recess. The heatsink may be pivotably coupled to a second end of the lever opposite the first end. The heatsink may be movable in a translation direction transverse to the longitudinal axis. The heatsink may be translatable between first and second positions as a result of the lever rotating relative to the frame. The first position may be located outside of the longitudinal recess. The second position may be located inside the aperture and partially inside the longitudinal recess.

The lever may be configured to rotate as a result of contact between an insertion end of the module and the first end of the lever. The lever may be a first lever. The cage may also include a second lever pivotably coupled to the frame. A first end of the second lever may extend into the longitudinal recess. A second end of the second lever may be pivotably coupled to the heatsink. The heatsink may be translatable between the first and second positions as a result of both the first and second levers simultaneously rotating relative to the frame. The frame may include a fulcrum fixedly mounted to one or more of the panels. The lever may be pivotably coupled to the fulcrum at a central portion of the lever located between the first and second ends. The longitudinal recess may have an open end and a closed end spaced apart from one another along the longitudinal axis. The first end of the lever may extend through a second one of the panels that forms the closed end of the longitudinal recess. The translation direction may be perpendicular to the longitudinal axis.

The cage may also include an energy storage element coupled to the lever and biasing the heatsink towards the first position. The energy storage element may be configured to translate the heatsink from the second position to the first position when the module is removed from the frame. The cage may also include a latch configured to be removably coupled to the module. The latch may be coupled to the first end of the lever. The latch may be configured to translate the heatsink from the second position towards the first position when the module is removed from the frame. The module may be a small form factor high power pluggable transceiver. A system may include a circuit panel and the cage described above. The frame may be fixedly mounted to a major surface of the circuit panel at a peripheral edge thereof.

Another aspect of the disclosure provides a method for removably inserting a module into a cage. The method may include inserting the module along a longitudinal axis into a longitudinal recess extending within a frame until the module contacts a first end of a lever that extends into the longitudinal recess. The lever may be pivotably coupled to the frame. The frame may include a plurality of panels joined to one another and together extending around the longitudinal recess. A first one of the panels may have an aperture defined therein in communication with the longitudinal recess. The method may also include rotating the lever relative to the frame. The method may also include translating a heatsink in a translation direction transverse to the longitudinal axis from a first position outside of the longitudinal recess to a second position inside the aperture and partially inside the longitudinal recess. The heatsink may be pivotably coupled to a second end of the lever opposite the first end. The heatsink may translate between the first and second positions as a result of the lever rotating relative to the frame.

The lever may be rotated as a result of contact between an insertion end of the module and the first end of the lever. The rotating of the lever relative to the frame may begin when the insertion end of the module contacts the first end of the lever. The lever may be a first lever. The cage may also include a second lever pivotably coupled to the frame. A first end of the second lever may extend into the longitudinal recess. A second end of the second lever may be pivotably coupled to the heatsink. The heatsink may translate between the first and second positions as a result of both the first and second levers simultaneously rotating relative to the frame. The frame may include a fulcrum fixedly mounted to one or more of the panels. The lever may be pivotably coupled to the fulcrum at a central portion of the lever located between the first and second ends. The longitudinal recess may have an open end and a closed end spaced apart from one another along the longitudinal axis. The first end of the lever may extends through a second one of the panels that forms the closed end of the longitudinal recess. The translation direction may be perpendicular to the longitudinal axis.

The method may also include removing the module from the longitudinal recess and translating the heatsink from the second position to the first position as a result of the lever rotating relative to the frame. The translation of the heatsink from the second position to the first position may be accomplished by release of energy stored in an energy storage component coupled to the lever and biasing the heatsink towards the first position. The method may also include removing the module from the longitudinal recess and translating the heatsink from the second position to the first position as a result of the lever rotating relative to the frame. The translation of the heatsink from the second position to the first position may be accomplished by a latch removably coupled to the first end of the lever. The latch may be configured to move the heatsink from the second position towards the first position when the module is removed from the frame. The module may be a small form factor high power pluggable transceiver. The frame may be fixedly mounted to a major surface of a circuit panel at a peripheral edge thereof.

DETAILED DESCRIPTION

The technology relates generally to a cage configured to removably receive a module, such as a small form factor high power pluggable transceiver, and a method for removably inserting such a module into a cage. For example, and as illustrated in FIGS. 1A through 2B, a system 100 may include a cage 110 and a circuit panel 120. A frame 111 of the cage 110 may be fixedly mounted to a major surface 121 of the circuit panel 120 at a peripheral edge 122 thereof. The cage 110 may be configured to removably receive a module 102 therein.

The module 102 may be a small form factor high power pluggable transceiver, which may be an optical module that has a high thermal load compared to conventional optical modules. The power consumption of such an optical module may require almost double the power consumption of a conventional optical module while maintaining the same exterior form factor.

The frame 111 of the cage 110 may include a plurality of panels 112 joined to one another, the panels together extending around a longitudinal recess 113 configured to receive the module 102 therein. The longitudinal recess 113 may define a longitudinal axis LA thereof that extends in opposite first and second longitudinal directions D1 and D2 between an open end 114 and a closed end 115 of the longitudinal recess, the open and closed ends being spaced apart from one another along the longitudinal axis.

A first panel 116 of the frame 111 may have an aperture 117 defined therein in communication with the longitudinal recess 113. As shown in FIGS. 1A through 2B, the aperture 117 may extend within a central portion of the first panel 116, but in other embodiments (not shown), the aperture may extend anywhere within the first panel. The aperture 117 may occupy any amount of the area of the first panel 116, including for example, about 50% of the area of the first panel, between 40% and 60% of the area of the first panel, or between 25% and 75% of the area of the first panel, among others.

The cage 110 may also include one or more levers 130 each pivotally coupled to the frame 111. The levers 130 may each have a first end 131 that extends into the longitudinal recess 113 and a second end 132 that is located opposite from the first end. As shown in FIGS. 1B and 2B, there are two levers 130 (which may be a first lever 130a and a second lever 130b), but in other embodiments (not shown), there may be any number of levers pivotally coupled to the frame 111, such as one, three, four, five, six, or eight. The first end of each lever 130 may extend into the longitudinal recess 113 through a second panel 118 of the panels 112. The second panel 118 may form the closed end 115 of the longitudinal recess.

The frame 111 may include a fulcrum 133 fixedly mounted to one or more of the panels 112. As shown in FIGS. 1A through 2B, the fulcrum 133 may be fixedly mounted to the first panel 116, but in other embodiments (not shown), the fulcrum may be fixedly mounted to anywhere within the first panel, anywhere within any of the other panels 112, or anywhere along the circuit panel 120. The lever 130 may be pivotably coupled to the fulcrum 113 at a central portion 133 of the lever located between the first and second ends 131, 132.

The cage 110 may also include one or more heatsinks 140 each pivotably coupled to the second end 132 of one or more of the levers 130 opposite the first end 131 thereof. As shown in FIGS. 1B and 2B, a single heatsink 140 is pivotably coupled to the second end 132 of two levers 130, the levers being coupled to the heatsink on opposite lateral sides 141a, 141b of the heatsink. In other examples (not shown), the levers 130 may be coupled to the heatsink 140 at other locations, such as a top surface 142 of the heatsink.

The heatsink 140 may be movable in a translation direction D3 transverse to the longitudinal axis LA, the heatsink being translatable between a first position P1 and a second position P2 as a result of the lever or levers 130 rotating relative to the frame 111. As shown in the figures, the first position P1 is outside of the longitudinal recess 113, and the second position P2 is inside the aperture 117 and partially inside the longitudinal recess.

In other examples (not shown), the first position P1 may be inside the aperture 117 and partially inside the longitudinal recess 113, and the second position P2 may be partially or fully inside the longitudinal recess. The invention contemplates any locations of the first position P1 and the second position P2, so long as the second position extends further into the longitudinal recess 113 than the first position, such that when the module 102 is engaged within the longitudinal recess, the second position disposes a bottom surface 143 of the heatsink 140 in complete or substantially complete surface contact with a top surface 104 (or confronting surface) of the module, and the first position disposes the bottom surface of the heatsink spaced apart from the top surface of the module. The surface contact between the bottom surface 143 of the heatsink 140 and the top surface 104 of the module may occupy any amount of the area of the top surface of the module, including for example, about 50% of the area of the top surface of the module, between 40% and 60% of the area of the top surface of the module, or between 25% and 75% of the area of the top surface of the module, among others.

As shown in the figures, the translation D3 is perpendicular to the longitudinal axis LA, but that need always be the case. In other examples (not shown), the translation direction D3 may be transverse to the longitudinal axis LA, and may be for example, between 80 and 100 degrees relative to the longitudinal axis, between 75 and 115 degrees relative to the longitudinal axis, or between 60 and 120 degrees relative to the longitudinal axis, among others.

The cage 110 may also include an energy storage element 150 coupled to the lever 130 and biasing the heatsink 140 towards the first position P1, such that the energy storage element is configured to translate the heatsink from the second position P2 to the first position when the module 102 is removed from the frame 111. In one example, the energy storage element 150 may be a coil spring that pivotally couples the lever 130 to the fulcrum 133, by having a first end that is fixedly attached to the lever and a second opposite end that is fixedly attached to the fulcrum. In other examples (not shown), other energy storage elements may be used in place of or in addition to the coil spring, such as a living hinge, an elastic polymer, or the like.

The one or more levers 130 may each be configured to rotate about the fulcrum 133 as a result of contact between an insertion end 106 of the module 102 and the first end 131 of each of the levers that extends into the longitudinal recess 113. As the module 102 is inserted into the open end 114 of the longitudinal recess 113 and approaches the closed end 115, the insertion end 106 of the module moves increasingly closer to the first end 131 of the levers 130.

Figure 1A:
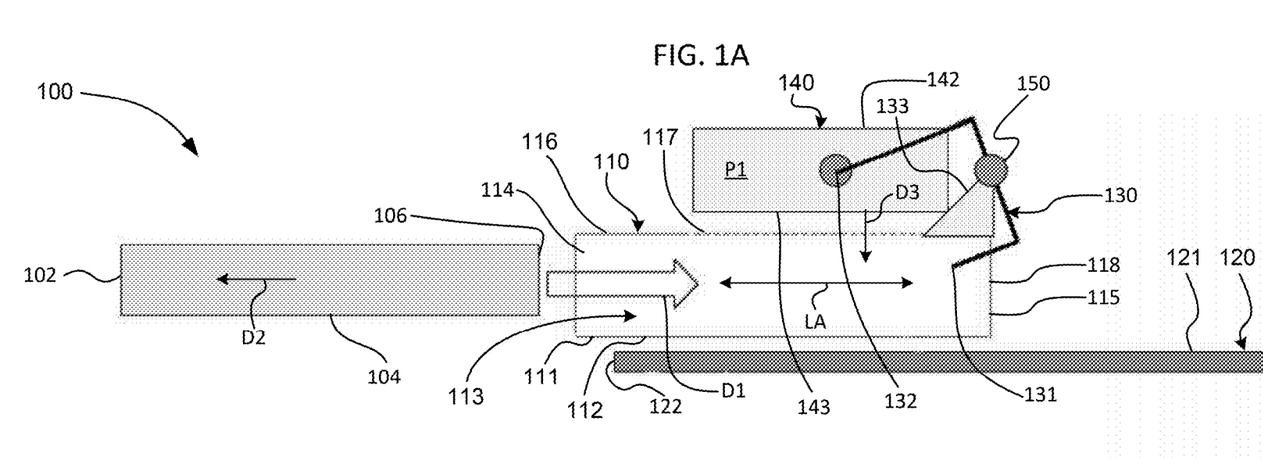
FIG. 1A shows a side view of a module about to be inserted into a cage, in accordance with aspects of the disclosure.
Figure 1B:
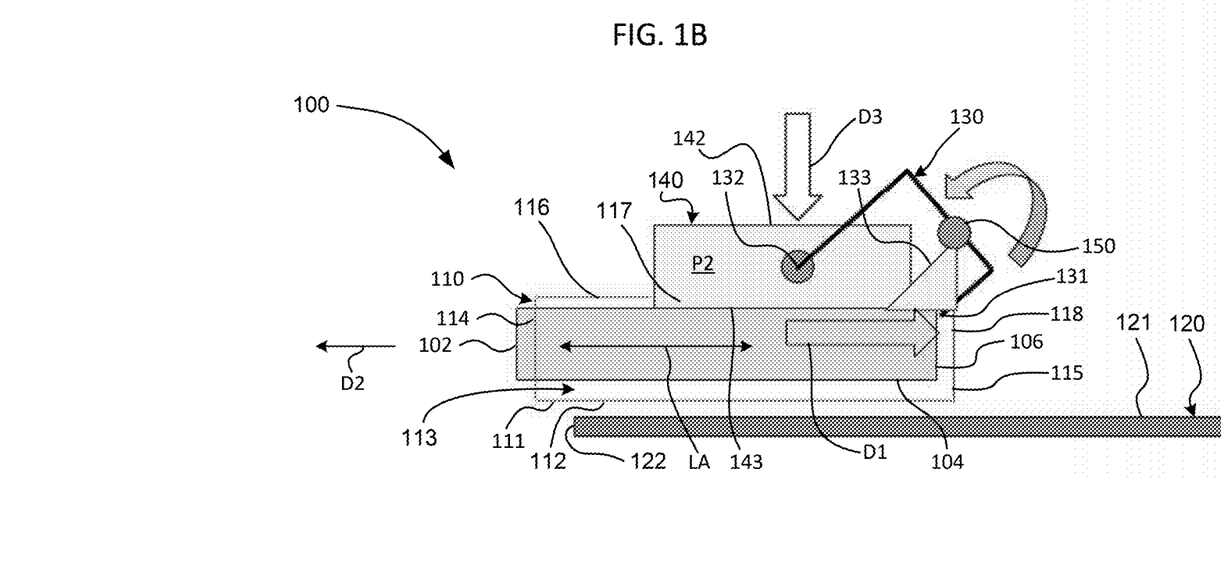
FIG. 1B shows a side view of a module fully inserted into the cage of FIG. 1A.
Figure 2A:
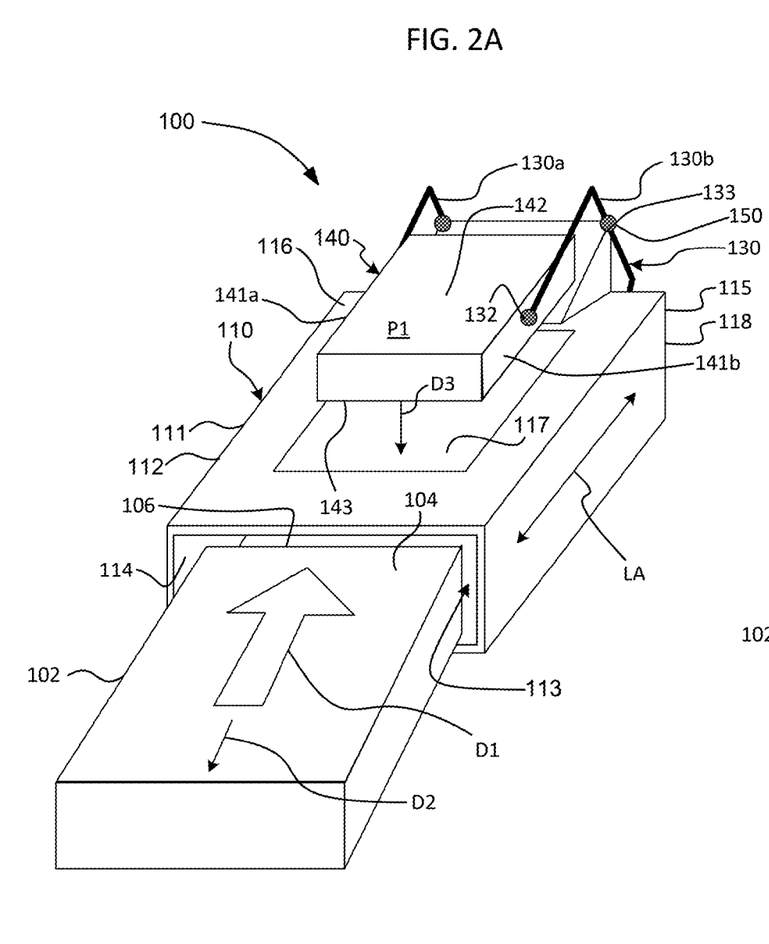
FIG. 2A shows a perspective view of the module about to be inserted into the cage of FIG. 1A.
Figure 2B:
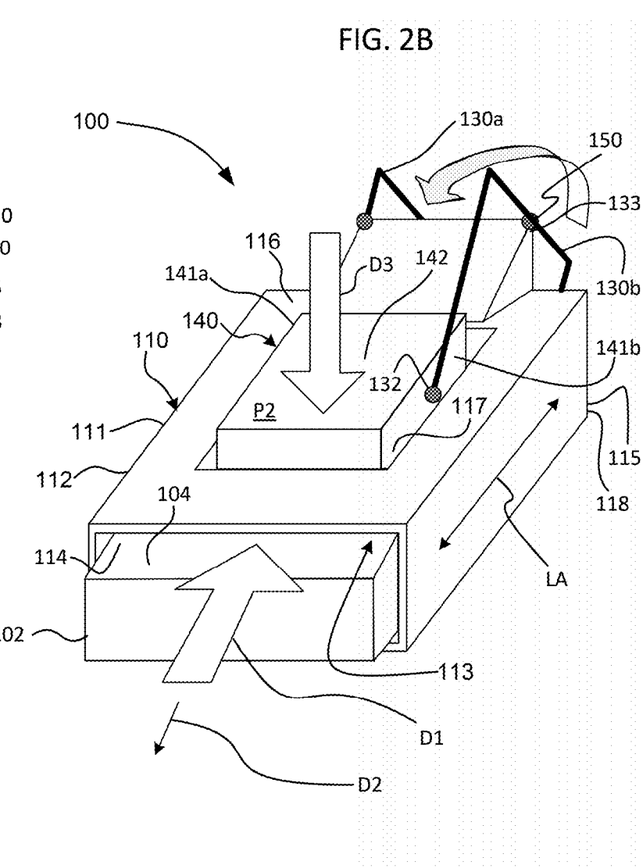
FIG. 2B shows a perspective view of the module fully inserted into the cage of FIG. 1B.

This movement of the insertion end 106 of the module 102 can be seen by comparing FIG. 1A, in which the module is disposed outside of the longitudinal recess 113, with FIG. 1B, in which the insertion end of the module contacts the first end 131 of the levers 130. The rotating of the levers 130 relative to the frame 111 begins when the insertion end 106 of the module contacts the first end 131 of the levers. This contact between the insertion end 106 of the module 102 and the first end 131 of the levers 130, in a situation in which the levers may not be visible to a user located outside of the longitudinal recess 113, may be referred to as a "blind mate" or a "blind mating" between the module and the levers that actuates the movement of the heatsink 140 to place the heatsink in complete or substantially complete surface contact with the module.

Figure 3A:
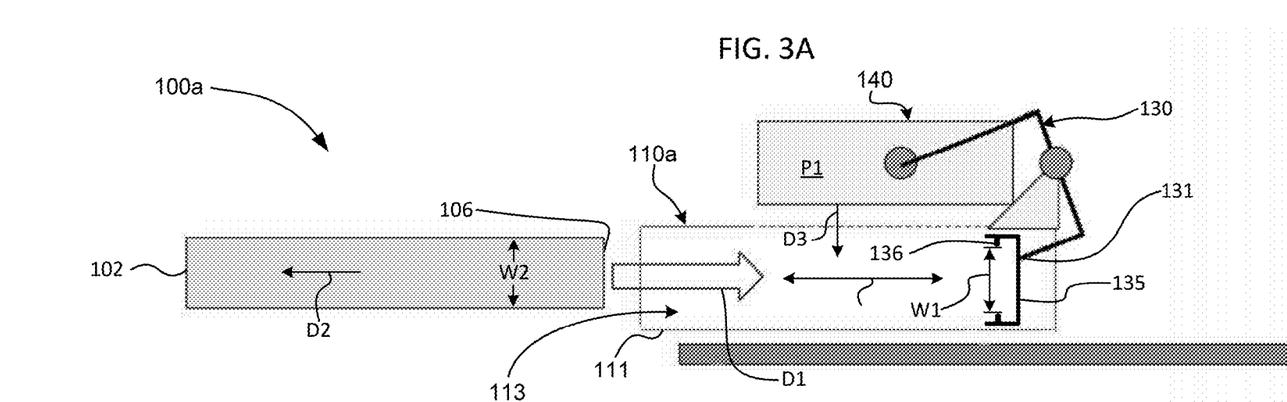
FIG. 3A is a side view of a module about to be inserted into a cage that is a variation of the cage of FIG. 1A.
Figure 3B:
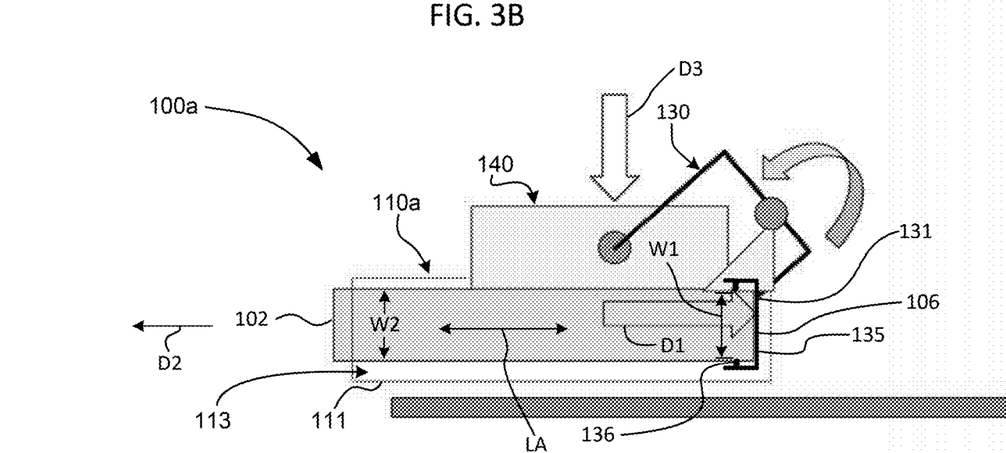
FIG. 3B is a side view of a module fully inserted into the cage of FIG. 3A.

FIGS. 3A and 3B show a system 100a that is a variation of the system 100 of FIGS. 1A through 2B. All elements of the system 100a are the same as the system 100 except for those that are described below. All elements of the system 100 that are described above may be incorporated into the system 100a in the same way that they are described above.

The system 100a includes a cage 110a having a latch 135 that is either affixed to or pivotably coupled to the first end 131 of the levers 130. The latch 135 may be configured to be removably coupled to the module 102. The latch 135 may be coupled to the first end 131 of each the levers 130, such that the latch is configured to translate the heatsink 140 from the second position P2 towards the first position P1 when the module 102 is removed from the frame 111. The latch 135 may be configured to translate within the longitudinal recess 113 along the longitudinal axis LA in the first and second directions D1, D2.

The latch 135 may have two or more protrusions 136 that may removably grip the module 102 when the insertion end 106 of the module is engaged into the latch. The protrusions 136 may be separated by a first width W1 that is less than a second width W2 of the insertion end 106 of the module 102, such that the insertion end of the module is press fit between the protrusions upon insertion into the latch 135.

When a user desires to withdraw the module 102 from the longitudinal recess 113, the user may apply a first smaller pulling force in the second direction D2 that initially lifts the heatsink 140 out of engagement with the top surface 104 of the module and moves the heatsink towards the first position P1. Then, the user may apply a second larger pulling force in the second direction D2 that is sufficient to overcome the press fit force between the protrusions 136 and the insertion end 106 of the module 102, thereby releasing the module from the latch 135.

Figure 4:
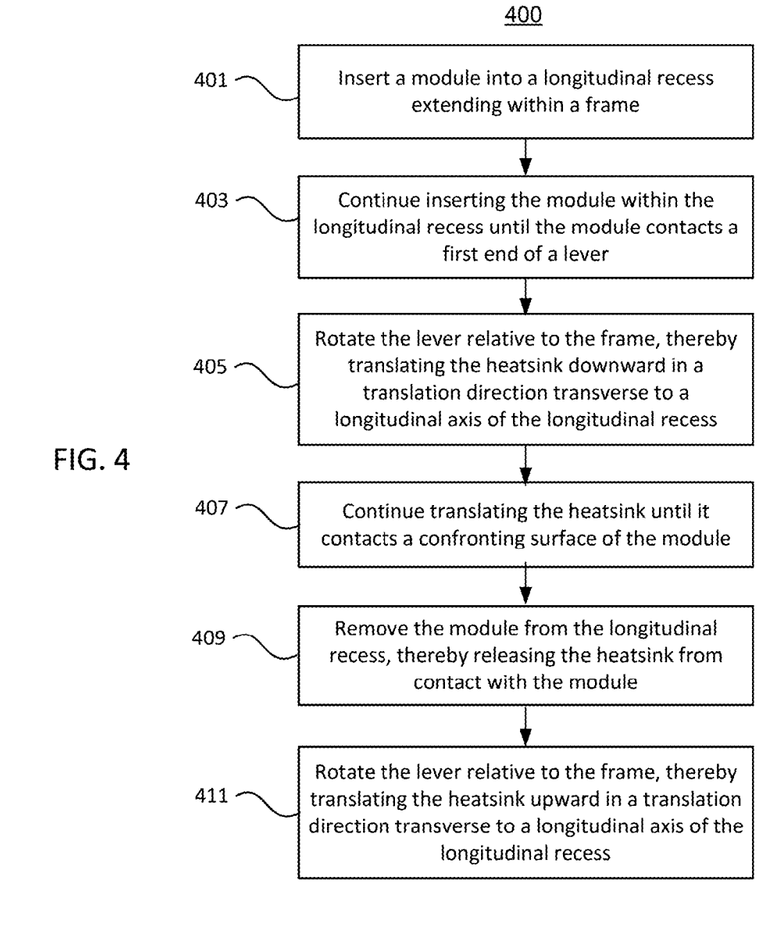
FIG. 4 is a flow chart in accordance with one aspect of the disclosure.

Referring to FIG. 4, in addition to the operations described above and illustrated in the figures, various operations will now be described. The following operations do not have to be performed in the precise order described below. Rather, various steps can be handled in a different order or simultaneously, and steps may also be added or omitted. FIG. 4 illustrates a flow chart 400 showing an example insertion operation of the module 102 into the cage 110 or 110a. As shown in block 401, the module 102 may be inserted into the longitudinal recess 113 of the cage 110 or 110a manually by a user, or by a robotic arm via an input or command, such as a selection on an input device.

As shown in block 403, the module 102 may be inserted into the longitudinal recess 113 within the frame 111 until the insertion end 106 of the module contacts the first end 131 of the levers 130, or alternatively with the cage 110a, until the insertion end of the module becomes engaged into the latch 135. Next in block 405, the contact between the module 102 and the one or more levers 130 causes the levers to simultaneously rotate relative to the frame 111, which thereby translates the heatsink 140 from the first position P1 downward in the translation direction D3 transverse to the longitudinal axis LA of the longitudinal recess 113.

In block 407, the one or more levers 130 continue to rotate relative to the frame 111 and continue translating the heatsink 140 to the second position inside the aperture 117 and partially inside the longitudinal recess 117, until the bottom surface 143 of the heatsink contacts the top surface 104 (or confronting surface) of the module 102 with a complete or substantially complete surface contact. Next in block 409, when it is desired to remove the module from the longitudinal recess 113, a user or a robotic arm may apply a pulling force in the second direction D2 that lifts the heatsink 140 out of engagement with the top surface 104 of the module 102 and moves the heatsink back towards the first position P1.

In block 411, when using the cage 110, the heatsink 140 is translated out of engagement with the module 102 by release of energy stored in the energy storage element 150 as the insertion end 106 of the module releases its pressing force onto the first end 131 of the levers 130. Alternatively, when using the cage 110a, the heatsink 140 is translated out of engagement with the module 102 by the latch 135 pulling the first end 131 of the levers 130 generally in the second direction D2, and the module is withdrawn from the latch once the pulling force overcomes the press fit force between the protrusions 136 and the insertion end 106 of the module, thereby releasing the module from the latch.

Unless otherwise stated, the foregoing alternative examples are not mutually exclusive, but may be implemented in various combinations to achieve unique advantages. As these and other variations and combinations of the features discussed above can be utilized without departing from the subject matter defined by the claims, the foregoing description of the embodiments should be taken by way of illustration rather than by way of limitation of the subject matter defined by the claims. In addition, the provision of the examples described herein, as well as clauses phrased as "such as," "including" and the like, should not be interpreted as limiting the subject matter of the claims to the specific examples; rather, the examples are intended to illustrate only one of many possible embodiments. Further, the same reference numbers in different drawings can identify the same or similar elements.

The invention claimed is:

1. A cage configured to removably receive a module, the cage comprising:
   a frame comprising a plurality of panels joined to one another, the panels together extending around a longitudinal recess configured to receive the module therein, the longitudinal recess defining a longitudinal axis thereof; a first one of the panels having an aperture defined therein in communication with the longitudinal recess;
   a lever pivotably coupled to the frame, a first end of the lever extending into the longitudinal recess;
   a heatsink pivotably coupled to a second end of the lever, the second end being at a different angular position than the first end, the heatsink being movable in a translation direction transverse to the longitudinal axis, the heatsink being translatable between first and second positions as a result of travel of the first end within the longitudinal recess in a direction having an angular disposition relative to the longitudinal axis causing the lever to rotate relative to the frame, the first position being outside of the longitudinal recess, the second position being inside the aperture and partially inside the longitudinal recess.

2. The cage of claim 1, wherein the lever is configured to rotate as a result of contact between an insertion end of the module and the first end of the lever.

3. A cage configured to removably receive a module, the cage comprising:
   a frame comprising a plurality of panels joined to one another, the panels together extending around a longitudinal recess configured to receive the module therein, the longitudinal recess defining a longitudinal axis thereof; a first one of the panels having an aperture defined therein in communication with the longitudinal recess;
   a lever pivotably coupled to the frame, a first end of the lever extending into the longitudinal recess;
   a heatsink pivotably coupled to a second end of the lever, the second end being at a different angular position than the first end, the heatsink being movable in a translation direction transverse to the longitudinal axis, the heatsink being translatable between first and second positions as a result of the lever rotating relative to the frame, the first position being outside of the longitudinal recess, the second position being inside the aperture and partially inside the longitudinal recess;
   wherein the lever is a first lever, the cage further comprising a second lever pivotably coupled to the frame, a first end of the second lever extending into the longitudinal recess, a second end of the second lever being pivotably coupled to the heatsink, the heatsink being translatable between the first and second positions as a result of both the first and second levers simultaneously rotating relative to the frame.

4. The cage of claim 1, wherein the frame includes a fulcrum fixedly mounted to one or more of the panels, the lever being pivotably coupled to the fulcrum at a central portion of the lever located between the first and second ends.

5. The cage of claim 1, wherein the longitudinal recess has an open end and a closed end spaced apart from one another along the longitudinal axis, and the first end of the lever extends through a second one of the panels that forms the closed end of the longitudinal recess.

6. The cage of claim 1, wherein the translation direction is perpendicular to the longitudinal axis.

7. The cage of claim 1, further comprising an energy storage element coupled to the lever and biasing the heatsink towards the first position, such that the energy storage element is configured to translate the heatsink from the second position to the first position when the module is removed from the frame.

8. The cage of claim 1, further comprising a latch configured to be removably coupled to the module, the latch being coupled to the first end of the lever, such that the latch is configured to translate the heatsink from the second position towards the first position when the module is removed from the frame.

9. The cage of claim 1, wherein the module is a small form factor high power pluggable transceiver.

10. A system comprising a circuit panel and the cage of claim 1, wherein the frame is fixedly mounted to a major surface of the circuit panel at a peripheral edge thereof.

11. A method for removably inserting a module into a cage, the method comprising:
    inserting the module along a longitudinal axis into a longitudinal recess extending within a frame until the module contacts a first end of a lever that extends into the longitudinal recess, the lever being pivotably coupled to the frame, the frame comprising a plurality of panels joined to one another and together extending around the longitudinal recess, a first one of the panels having an aperture defined therein in communication with the longitudinal recess;
    rotating the lever relative to the frame; and
    translating a heatsink in a translation direction transverse to the longitudinal axis from a first position outside of the longitudinal recess to a second position inside the aperture and partially inside the longitudinal recess and contacting the module, the heatsink being pivotably coupled to a second end of the lever, the second end being at a different angular position than the first end, the heatsink translating between the first and second positions as a result of the lever rotating relative to the frame caused by travel of the module along the longitudinal axis while the first end of the lever is in contact with the module.

12. The method of claim 11, wherein the lever is rotated as a result of contact between an insertion end of the module and the first end of the lever, and the rotating of the lever relative to the frame begins when the insertion end of the module contacts the first end of the lever.

13. The method of claim 11, wherein the lever is a first lever, the cage further comprising a second lever pivotably coupled to the frame, a first end of the second lever extending into the longitudinal recess, a second end of the second lever being pivotably coupled to the heatsink, the heatsink translating between the first and second positions as a result of both the first and second levers simultaneously rotating relative to the frame.

14. The method of claim 11, wherein the frame includes a fulcrum fixedly mounted to one or more of the panels, the lever being pivotably coupled to the fulcrum at a central portion of the lever located between the first and second ends.

15. The method of claim 11, wherein the longitudinal recess has an open end and a closed end spaced apart from one another along the longitudinal axis, and the first end of the lever extends through a second one of the panels that forms the closed end of the longitudinal recess.

16. The method of claim 1, wherein the translation direction is perpendicular to the longitudinal axis.

17. The method of claim 11, further comprising removing the module from the longitudinal recess and translating the heatsink from the second position to the first position as a result of the lever rotating relative to the frame, the translation of the heatsink from the second position to the first position being accomplished by release of energy stored in an energy storage component coupled to the lever and biasing the heatsink towards the first position.

18. The method of claim 11, further comprising removing the module from the longitudinal recess and translating the heatsink from the second position to the first position as a result of the lever rotating relative to the frame, the translation of the heatsink from the second position to the first position being accomplished by a latch removably coupled to the first end of the lever, so that the latch is configured to move the heatsink from the second position towards the first position when the module is removed from the frame.

19. The method of claim 11, wherein the module is a small form factor high power pluggable transceiver.

20. The method of claim 11, wherein the frame is fixedly mounted to a major surface of a circuit panel at a peripheral edge thereof.

\* \* \* \* \*